(12) United States Patent
Fjelstad et al.

(10) Patent No.: US 7,989,929 B2
(45) Date of Patent: Aug. 2, 2011

(54) DIRECT-CONNECT SIGNALING SYSTEM

(75) Inventors: Joseph C. Fjelstad, Maple Valley, WA (US); Para K. Segaram, Campbell, CA (US); Belgacem Haba, Cupertino, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 403 days.

(21) Appl. No.: 11/930,217

(22) Filed: Oct. 31, 2007

(65) Prior Publication Data

US 2009/0108416 A1    Apr. 30, 2009

Related U.S. Application Data

(62) Division of application No. 10/426,930, filed on Apr. 29, 2003, now Pat. No. 7,307,293.

(60) Provisional application No. 60/376,482, filed on Apr. 29, 2002, provisional application No. 60/400,180, filed on Jul. 31, 2002.

(51) Int. Cl.
*H01L 23/48* (2006.01)

(52) U.S. Cl. ........ 257/664; 257/661; 257/662; 257/665; 257/686; 257/738; 257/E23.01

(58) Field of Classification Search .................. 257/664, 257/E23.01, 661, 662, 665, 686, 738
See application file for complete search history.

(56) References Cited

U.S. PATENT DOCUMENTS

| | | | |
|---|---|---|---|
| 3,795,845 A * | 3/1974 | Cass et al. |
| 4,095,866 A * | 6/1978 | Merrill |
| 4,202,007 A * | 5/1980 | Dougherty et al. |
| 4,302,501 A * | 11/1981 | Nagashima |
| 4,445,735 A * | 5/1984 | Bonnefoy |
| 4,458,297 A * | 7/1984 | Stopper et al. |
| 4,543,715 A * | 10/1985 | Iadarola et al. |
| 4,551,673 A * | 11/1985 | Barth et al. |
| 4,636,919 A * | 1/1987 | Itakura et al. |
| 4,644,092 A * | 2/1987 | Gentry |
| 4,675,243 A * | 6/1987 | Obinata et al. |
| 4,730,159 A * | 3/1988 | Collins |
| 4,731,643 A * | 3/1988 | Dunham et al. |
| 4,748,495 A * | 5/1988 | Kucharek |
| 4,768,154 A * | 8/1988 | Sliwkowski et al. |
| 4,799,617 A * | 1/1989 | Friedman |
| 4,812,792 A * | 3/1989 | Leibowitz |
| 4,814,945 A * | 3/1989 | Leibowitz |

(Continued)

FOREIGN PATENT DOCUMENTS

JP    61-287253 A    12/1986
(Continued)

OTHER PUBLICATIONS

PCT International Search Report, dated nov. 3, 2003, 8 pages.*

*Primary Examiner* — Ngan Ngo
*Assistant Examiner* — Benjamin Tzu-Hung Liu
(74) *Attorney, Agent, or Firm* — Myers Bigel Sibley & Sajovec, P.A.

(57) ABSTRACT

A direct-connect signaling system including a printed circuit board and first and second integrated circuit packages disposed on the printed circuit board. A plurality of electric signal conductors extend between the first and second integrated circuit packages suspended above the printed circuit board.

29 Claims, 15 Drawing Sheets

U.S. PATENT DOCUMENTS

| | | | |
|---|---|---|---|
| 4,838,800 A * | 6/1989 | Lynch | |
| 4,861,251 A * | 8/1989 | Moitzger | |
| 4,881,905 A * | 11/1989 | Demler, Jr. et al. | |
| 4,912,603 A * | 3/1990 | Seyama | |
| 4,935,584 A * | 6/1990 | Boggs | |
| 4,956,749 A * | 9/1990 | Chang | |
| 4,960,386 A * | 10/1990 | Stanevich | |
| 4,969,826 A * | 11/1990 | Grabbe | |
| 4,982,311 A * | 1/1991 | Dehaine et al. | |
| 4,991,115 A * | 2/1991 | Guthrie et al. | |
| 4,994,938 A * | 2/1991 | Baudouin | |
| 5,009,611 A * | 4/1991 | Regnier | |
| 5,012,924 A * | 5/1991 | Murphy | |
| 5,019,946 A * | 5/1991 | Eichelberger et al. | |
| 5,136,123 A * | 8/1992 | Kobayashi et al. | |
| 5,155,577 A * | 10/1992 | Chance et al. | |
| 5,162,792 A * | 11/1992 | Morris | |
| 5,165,984 A * | 11/1992 | Schoenthaler | |
| 5,185,502 A * | 2/1993 | Shepherd et al. | |
| 5,220,490 A * | 6/1993 | Weigler et al. | |
| 5,222,014 A * | 6/1993 | Lin | |
| 5,227,013 A * | 7/1993 | Kumar | |
| 5,291,375 A * | 3/1994 | Mukai | |
| 5,306,162 A | 4/1994 | Armendariz | |
| 5,309,324 A * | 5/1994 | Herandez et al. | |
| 5,319,224 A * | 6/1994 | Sakashita et al. | |
| 5,343,074 A * | 8/1994 | Higgins et al. | 257/668 |
| 5,417,577 A * | 5/1995 | Holliday et al. | |
| 5,424,492 A * | 6/1995 | Petty et al. | |
| 5,441,917 A * | 8/1995 | Rostoker et al. | |
| 5,490,040 A * | 2/1996 | Gaudenzi et al. | |
| 5,491,364 A * | 2/1996 | Brandenburg et al. | |
| 5,498,767 A * | 3/1996 | Huddleston et al. | |
| 5,500,862 A * | 3/1996 | Kawamura | |
| 5,544,018 A * | 8/1996 | Sommerfeldt et al. | |
| 5,545,301 A * | 8/1996 | Friese et al. | |
| 5,578,870 A * | 11/1996 | Farnsworth et al. | |
| 5,584,721 A * | 12/1996 | Taniuchi et al. | |
| 5,587,944 A * | 12/1996 | Shen et al. | |
| 5,596,205 A * | 1/1997 | Reedy et al. | |
| 5,634,093 A * | 5/1997 | Ashida et al. | |
| 5,635,424 A | 6/1997 | Rostoker et al. | |
| 5,644,500 A | 7/1997 | Miura et al. | |
| 5,684,332 A | 11/1997 | Chen et al. | |
| 5,686,699 A | 11/1997 | Chu et al. | |
| 5,691,569 A | 11/1997 | Palmer | |
| 5,706,178 A | 1/1998 | Barrow | |
| 5,715,274 A | 2/1998 | Rostoker et al. | |
| 5,729,432 A | 3/1998 | Shim et al. | |
| 5,730,606 A | 3/1998 | Sinclair | |
| 5,745,374 A | 4/1998 | Matsumoto | |
| 5,774,340 A | 6/1998 | Chang et al. | |
| 5,781,446 A | 7/1998 | Wu | |
| 5,784,262 A | 7/1998 | Sherman | |
| 5,786,631 A | 7/1998 | Fishley et al. | |
| 5,790,383 A | 8/1998 | Inagawa | |
| 5,819,403 A | 10/1998 | Crane, Jr. et al. | |
| 5,822,214 A | 10/1998 | Rostoker et al. | |
| 5,912,808 A | 6/1999 | Ikemoto | |
| 5,977,640 A | 11/1999 | Bertin et al. | |
| 6,060,772 A | 5/2000 | Sugawara et al. | |
| 6,087,732 A | 7/2000 | Chittipeddi et al. | |
| 6,121,679 A | 9/2000 | Luvara et al. | |
| 6,137,064 A | 10/2000 | Kiani et al. | |
| 6,150,729 A | 11/2000 | Ghahghahi | |
| 6,264,476 B1 | 7/2001 | Li et al. | |
| 6,285,560 B1 | 9/2001 | Lyne | |
| 6,304,450 B1 | 10/2001 | Dibene, II et al. | |
| 6,310,303 B1 | 10/2001 | Luvara et al. | |
| 6,310,398 B1 | 10/2001 | Katz | |
| 6,388,208 B1 | 5/2002 | Kiani et al. | |
| 6,410,983 B1 | 6/2002 | Moriizumi | |
| 6,507,496 B2 | 1/2003 | Levy et al. | |
| 6,547,570 B2 | 4/2003 | Eskildsen et al. | |
| 6,559,531 B1 | 5/2003 | Sutherland | |
| 6,594,811 B2 | 7/2003 | Katz | |
| 6,599,031 B2 | 7/2003 | Li | |
| 6,603,077 B2 | 8/2003 | Hirai | |
| 6,686,666 B2 | 2/2004 | Bodas | |
| 6,704,204 B1 | 3/2004 | Eskildsen et al. | |
| 6,797,891 B1 | 9/2004 | Blair et al. | |
| 6,867,668 B1 * | 3/2005 | Dagostino et al. | 333/246 |
| 6,893,885 B2 | 5/2005 | Lemmerhirt et al. | |
| 2001/0030361 A1 | 10/2001 | Gabara | |
| 2003/0042585 A1 | 3/2003 | Corisis | |
| 2003/0180006 A1 | 9/2003 | Loh et al. | |
| 2003/0222282 A1 * | 12/2003 | Fjelstad et al. | 257/200 |
| 2004/0094328 A1 | 5/2004 | Fjelstad et al. | |
| 2004/0113250 A1 | 6/2004 | Khandros et al. | |
| 2005/0133929 A1 | 6/2005 | Howard | |

FOREIGN PATENT DOCUMENTS

| | | |
|---|---|---|
| JP | 07-030224 | 1/1995 |
| JP | 2000-340917 A | 12/2000 |

* cited by examiner

FIG. 17A
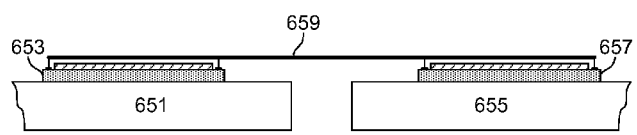
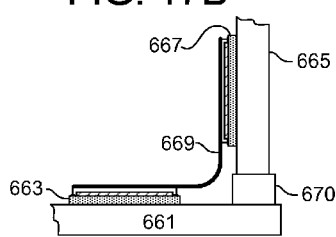
FIG. 17B
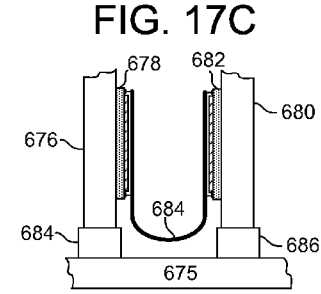
FIG. 17C
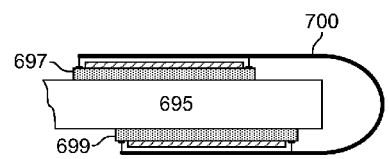
FIG. 17D
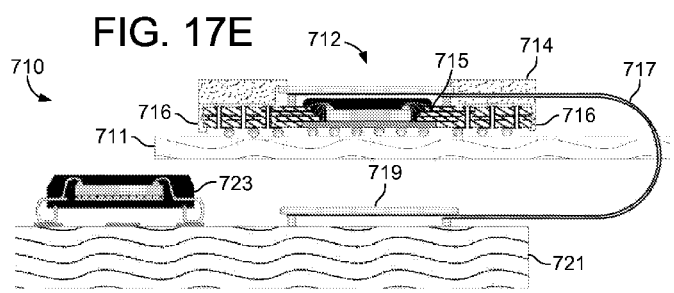
FIG. 17E
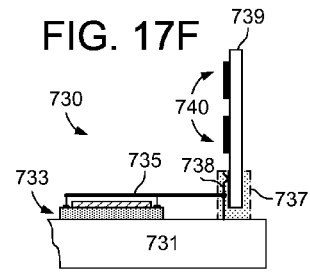
FIG. 17F

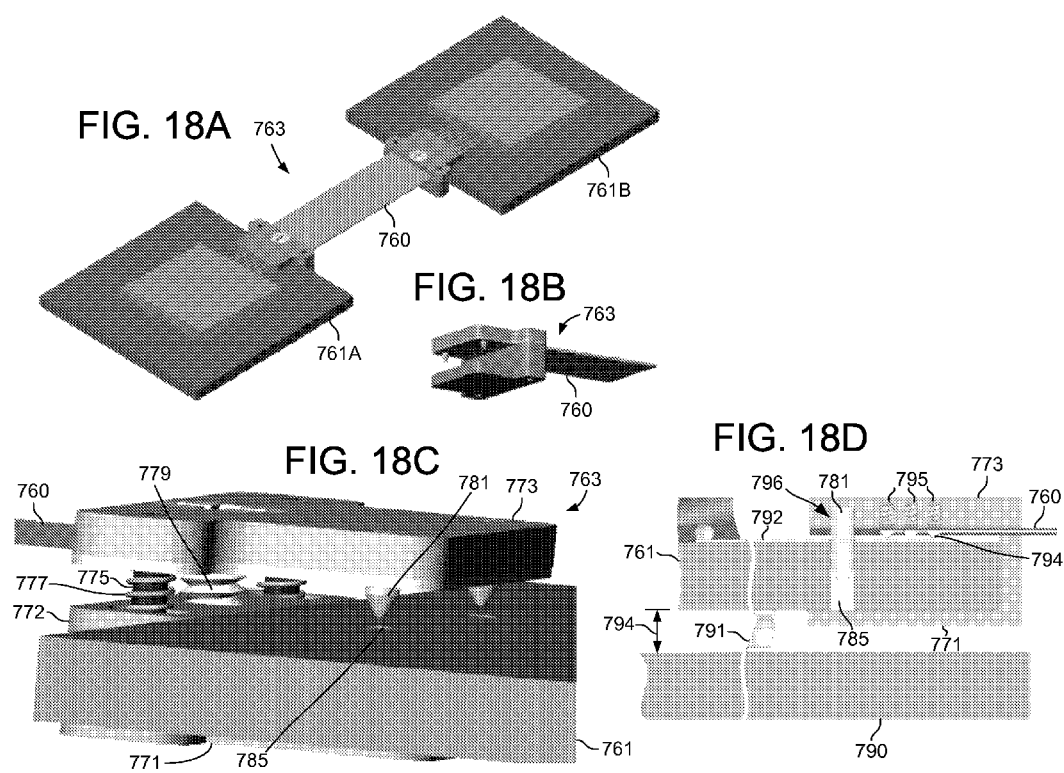

DIRECT-CONNECT SIGNALING SYSTEM

CROSS-REFERENCE TO RELATED APPLICATIONS

This application is a divisional application of U.S. patent application Ser. No. 10/426,930, filed Apr. 29, 2003 now U.S. Pat. No. 7,307,293, which claims the benefit of U.S. Provisional Application No. 60/376,482, filed Apr. 29, 2002, and U.S. Provisional Application No. 60/400,180, filed Jul. 31, 2002. This application incorporates by reference U.S. patent application Ser. No. 10/426,930 filed Apr. 29, 2003 and entitled "Direct-Connect Signaling System," U.S. Provisional Application No. 60/376,482, filed Apr. 29, 2002, and U.S. Provisional Application No. 60/400,180 filed Jul. 31, 2002.

FIELD OF THE INVENTION

The present invention relates generally to the field of electronic communications, and more particularly to interconnection structures for high speed signaling between integrated circuit devices.

BACKGROUND

To keep pace with the demand for ever faster signaling rates, integrated circuit (IC) packaging has evolved from relatively band-limited technologies such as wire-bonded packages to the prior-art flip-chip package 100 illustrated in FIG. 1. The flip-chip package 100 includes an integrated circuit die 103 mounted pad-side down on a multi-layer substrate 105 and enclosed within a non-conductive housing 101. Signal routing structures 110 are disposed within the multi-layer substrate 105 to redistribute signals from the relatively dense arrangement of die pads 107 to a more dispersed ball grid array (BGA) 109 on the underside of the package. The individual contact balls of the BGA 109 may then be soldered to counterpart landings on a printed circuit board.

While generally providing better performance than wire-bonded packages, the flip-chip package 100 presents a number challenges to system designers as signaling rates progress deeper into the gigahertz range. For example, the number of layers needed in substrate 105 for signal redistribution has steadily increased in response to increased numbers of die pads 107, making the flip-chip package 100 more complex and costly. Also, through-hole vias 110 (i.e., vias that extend all the way through the multi-layer substrate) are often used to route signals through the substrate. Unfortunately, unused portions of the vias (e.g., region 112) constitute stubs that add parasitic capacitance and produce signal reflections, both of which degrade signal quality. Although back-drilling and other techniques may be used to reduce the stub portions of the vias, such efforts further increase manufacturing costs and may not be suitable or possible for some package substrate constructions.

Another challenge presented by signal redistribution within the multi-layer substrate 105 is that differences in routing distances tend to introduce timing skew between simultaneously transmitted signals. That is, signals output simultaneously from the die 103 arrive at the BGA contacts 109 at different times, reducing the collective data-valid interval of the signals. In many systems, a single control signal, such as a clock or strobe, is used within a signal receiving device to trigger sampling of multiple simultaneously transmitted signals. Consequently, compression of the collective data-valid interval due to signal skew ultimately limits the maximum signaling rate that can be achieved in such systems without violating receiver setup or hold-time constraints. To avoid such skew-related problems, intricate routing schemes are often employed within the multi-layer substrate 105 to equalize the die-to-contact path lengths, further increasing the complexity and cost of the integrated circuit package 100.

FIG. 2 illustrates a prior art signaling system 120 that includes two flip-chip packages 100A and 100B coupled to one another via signal routing structures disposed within a multi-layer printed circuit board (PCB) 121. From a high-speed signaling perspective, many of the problems resulting from signal redistribution in the integrated circuit packages 100 also result from the multi-layer signal routing within the PCB 121. For example, through-hole vias 123 are often used to conduct signals between PCB layers, presenting stub capacitance and signal reflection problems. Also, the lengths of the signal paths routed between the integrated circuit packages 100A and 100B tend to be different due to different PCB ingress and egress points and different PCB submergence depths of the various traces 126, thereby introducing timing skew. As with the integrated circuit packages 100 themselves, a number of techniques may be used to reduce via stubs, and routing strategies may be used to equalize path lengths, but these solutions tend to increase system complexity and cost.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 17A-17F illustrate additional direct-connect signaling system embodiments;

FIGS. 18A-18D illustrate an exemplary connector system that may be used to establish a direct-connect cable connection between integrated circuit packages, or between an integrated circuit package and a printed circuit board;

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa.

In embodiments of the present invention high-speed signaling systems are implemented by connecting electric signal conductors directly between integrated circuit packages so that high-speed signals are transmitted without passing through traces or other conductive structures on a printed circuit board. In one embodiment, a pair of integrated circuit packages are mounted to a circuit board and coupled to one another via a cable suspended above the printed circuit board. High-speed signals are routed from one integrated circuit package to the other via the cable, while lower speed signals and system supply voltages are routed to the integrated circuit packages via traces and conductive structures in the printed circuit board. The cable, which is referred to herein as a direct-connect cable, may be removably or permanently secured to one or both of the integrated circuit packages. Also, in one embodiment, conductors within the cable are integral components of at least one of the integrated circuit packages, extending to contact die pads of one or more integrated circuit die included within the integrated circuit package. Although an elemental system includes two integrated circuit packages interconnected by a direct-connect cable, any number of additional ICs may be included in such a system and coupled to one or more others of the ICs via direct-connect cables. Also, direct-connect cables may be used to enable high-speed signaling between two or more integrated circuit dice included within a single integrated circuit package. Also, in other embodiments, direct-connect cables are used to establish high-speed signaling paths between integrated circuit devices mounted on different circuit boards, or on opposite sides of the same circuit board. These and other embodiments of the invention are disclosed in further detail below.

Figure 1:
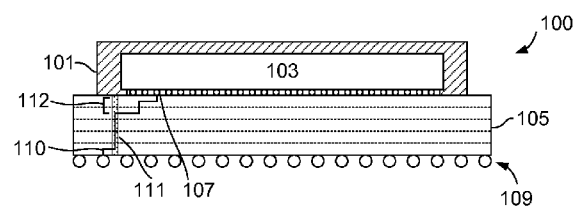
FIG. 1 illustrates a prior-art flip-chip integrated circuit package.
Figure 2:
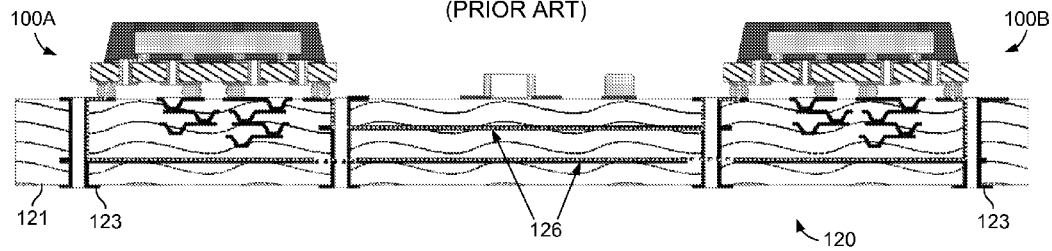
FIG. 2 illustrates a prior art signaling system.
Figure 3:
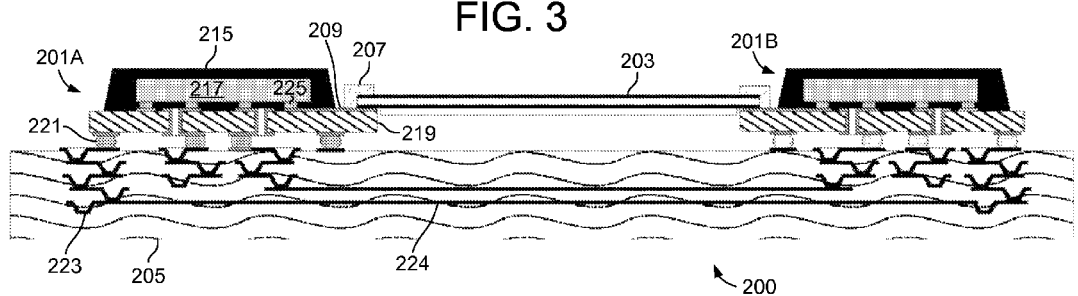
FIG. 3 illustrates a direct-connect signaling system according to an embodiment of the invention.

FIG. 3 illustrates a direct-connect signaling system 200 according to an embodiment of the invention. The signaling system 200 includes a pair of integrated circuit packages 201A and 201B (also referred to herein as "integrated circuit devices") mounted to a printed circuit board 205 and coupled to one another via a direct-connect cable 203. As shown, the direct-connect cable 203 is secured to each of the integrated circuit packages 201 and extends in an elevated fashion above the printed circuit board 205. That is, the cable 203 is suspended in air above the printed circuit board 205, enabling high-speed signals to be transmitted between the integrated circuit packages 201 without passing through traces or other conductive structures in the printed circuit board 205. By this arrangement, parasitic capacitance and signal reflections resulting from printed circuit board ingress and egress structures (e.g., conductive vias and the like) are avoided. Further, because the direct-connect cable 203 may be constructed with a set of same-length conductors, timing skew resulting from different signal path lengths through the printed circuit board 205 is also avoided. Note that while the direct-connect cable 203 is depicted in FIG. 3 as being supported only by the connections to integrated circuit packages 201, one or more mechanical supports may optionally be disposed beneath the cable 203.

In the embodiment of FIG. 3, each of the integrated circuit packages 201 is a flip-chip package that includes an integrated circuit die 217 mounted pad-side down on the top surface of a substrate 219. The integrated circuit die 217 may optionally be encapsulated in a nonconductive housing 215 (e.g., formed from ceramic or polymeric material). The portion of the top surface of the substrate 219 not covered by the die 217 or the housing 215, constitutes an exposed region to which one or more direct-connect cables 203 may be attached. Accordingly, instead of routing high-speed signals through the substrate 219 to circuit board contacts 221 on the underside of the substrate 219, conductive traces 209 are disposed on the top surface of the substrate 219 and routed between high-speed I/O pads 225 (i.e., pads on the integrated circuit die 217 that are coupled to high-speed input/output (I/O) circuits formed on the die 217) and the exposed region of the substrate 219. A connector 207 is used to permanently or removably couple electric signal conductors (i.e., conductors capable of conveying electric current) within the direct-connect cable to the conductive traces 209. By this arrangement, the parasitic capacitance, signal reflections and timing skew resulting from signal redistribution in the substrate layer 219 are avoided.

Still referring to FIG. 3, supply voltages and lower-speed signals (i.e., signals not relied upon for high data throughput) may be routed through the package substrate 219 and printed circuit board 205 using conventional routing techniques (e.g., using the partial ingress vias 223 and PCB traces 224 shown in FIG. 3, or the like). Because a substantial number of the chip-to-chip connections may be carried by the direct-connect cable 203, signal routing in the package substrate 219 and printed circuit board 200 becomes substantially less congested, allowing the number of substrate and printed circuit board layers to be reduced. Also, by routing only skew-tolerant signals through the package substrate 219 and printed circuit board 205 (i.e., signals that need not arrive at a destination in a particular phase relationship with other signals), serpentine routing schemes and other schemes used to equalize signal path lengths in the package substrate 219 and printed circuit board 205 become unnecessary, further relieving routing congestion and simplifying construction of the package substrate 219 and printed circuit board 205. In one embodiment, all or nearly all signals are routed via one or more direct-connect cables 203 with only supply voltages (e.g., power and ground) and a negligible number of signals (or zero signals) being delivered via conductive structures in the printed circuit board 205 and package substrate 219. In such an embodiment, the printed circuit board 205 and/or package substrate 219 may be reduced to a simple construct having only a few substrate layers, or even a single layer.

Reflecting on FIG. 3, it should be noted that no changes are required in the printed circuit board 205 to implement the direct-connect signaling system 200. Thus, if a designer desires to migrate a system having multiple conventionally-routed signaling paths (i.e., through-circuit-board-routed systems) to a system having the direct-connect signal routing of FIG. 3, such migration may be achieved one signaling path at a time, without requiring board-level modification. Traces printed on the printed circuit board for conventional routing may simply be left unconnected, with a direct-connect cable providing the high-speed signaling path instead. As each signaling path (or group of signaling paths) within the system is successfully migrated to the direct-connect signaling arrangement, fabrication of the printed circuit board may be simplified by omitting the vestigial traces.

Yet another benefit of the direct-connect signaling system 200 is that high-speed testing (also known as "AC testing") may be executed through direct-connect cable connection between either of the integrated circuit packages 201 and a high-speed tester (not shown). As described below in further detail, high-speed testing of integrated circuit package 201A through a direct-connect cable connection obviates the need to tri-state device 201B, and avoids the parasitic capacitance and signal reflections that typically result from probing traces on the printed circuit board 205.

Figure 4A:
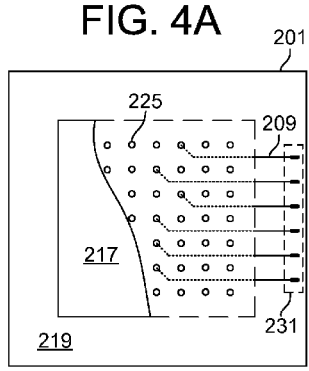
FIGS. 4A-4C illustrate top views of integrated circuit packages according to embodiments of the invention.

FIG. 4A is a top view of the integrated circuit package 201A of FIG. 3 with a portion of the housing 215 and integrated circuit die 217 rendered transparently to expose the die pads 225 (or bumps or other types of contacts formed on the integrated circuit die 217) and conductive traces 209 disposed on the package substrate 219. In one embodiment, the entire lengths of the conductive traces 209 extend along the surface of the substrate 219 from contacts with the die pads (which may be established by spring-type contacts, particle interconnect, or other high-density interconnect structure) to a contact zone 231 on the exposed region of the package substrate 219. In alternative embodiments, described below, the traces 209 may extend in whole or part along the underside (i.e., mounting side) of the substrate 219 or on an internal layer of the substrate 219.

Figure 4B:
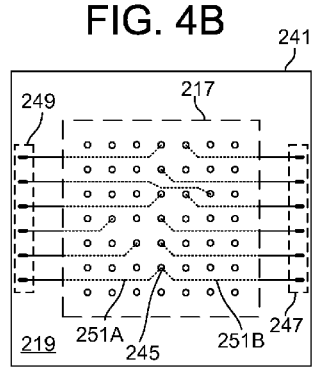
Figure 4C:
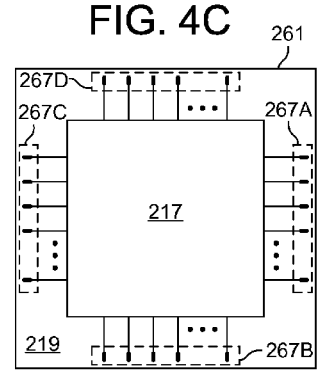

The traces 209 terminate in the contact zone 231, for example, in high density landings adapted to receive contacts from a direct-connect cable. Alternatively, the traces 209 may extend beyond the substrate 219 to form integral components of a direct-connect cable. Also, as shown in FIGS. 4B and 4C, additional contact zones (i.e., zones 247 and 249 in FIG. 4B; and zones 267A-267D in FIG. 4C) may be provided to enable connection to multiple direct-connect cables, or to enable connection a single direct-connect cable to contact the exposed region of the package substrate on opposite and/or adjacent sides of the integrated circuit die 217. Also, one or more of the traces 209 may include two or more trace segments that extend from a common die contact to different contact zones. For example, referring to FIG. 4B, trace 250 includes a trace segment 251A that extends from a die contact 245 to contact zone 249, and another trace segment 251B that extends from the die contact to contact zone 247. As discussed below, such multi-segment traces may be used to establish high-speed multi-drop connections (e.g., multi-drop buses) to any number of integrated circuit packages.

Figure 5A:
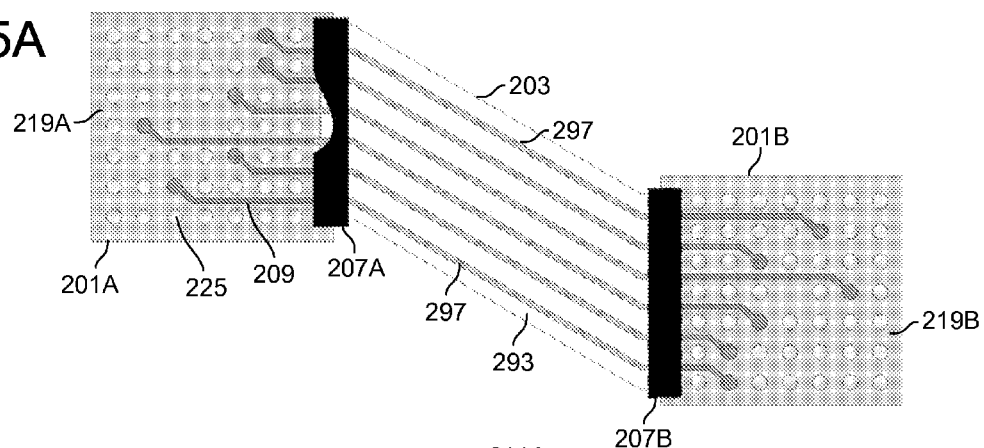
FIGS. 5A and 5B illustrate direct-connect cables according to embodiments of the invention.
Figure 5B:
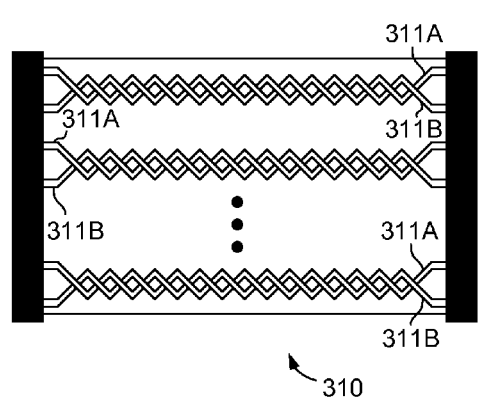

FIG. 5A is a top view of the integrated circuit packages 201A, 201B and direct-connect cable 203 of FIG. 3. The housing and integrated circuit die of each integrated circuit package 201 is rendered transparently to expose the die pads 225 and the conductive traces 209 disposed on the package substrate. In the embodiment shown, the direct connect cable 203 is a ribbon-style cable that includes a set of electric signal conductors 297 disposed in a coplanar arrangement within a flexible, low-loss dielectric material 293. Cable connectors 207A, 207B are used to establish connection between the electric signal conductors 297 and the traces 209 disposed on package substrates 219A and 219B, respectively. A sheet or web of conductive material (not shown) may be disposed above or below the conductors 297 for shielding purposes (e.g., by connection to ground or other reference voltage), thereby achieving a micro-stripline cable. Alternatively, a conductive sheet or web may be disposed both above and below the conductors 297 to form a coplanar stripline cable. Also, the electric signal conductors 297 themselves may be alternatively coupled to signal and ground to reduce crosstalk between neighboring signals. Further, as shown in FIG. 5B, pairs of conductors 311A, 311B within a direct-connect cable 310 may be disposed in a twisted-pair arrangement (e.g., crossing over one another but isolated by insulating material) to reduce inductive coupling. More than two conductors may be twisted together in yet other embodiments. Also, rather than a coplanar structure, the conductors may be disposed in a co-axial arrangement, or other three-dimensional construct. Further, while the direct-connect cable is preferably flexible to tolerate a wide range of interconnect distances and integrated circuit topologies, rigid interconnection structures may also be used. Although a single plane of conductors is illustrated in FIGS. 5A and 5B, multiple planes of conductors may be formed within the cables 203 and 310, with each plane being separated from neighboring planes by an insulating layer and, optionally, a shielding layer.

Figure 6:
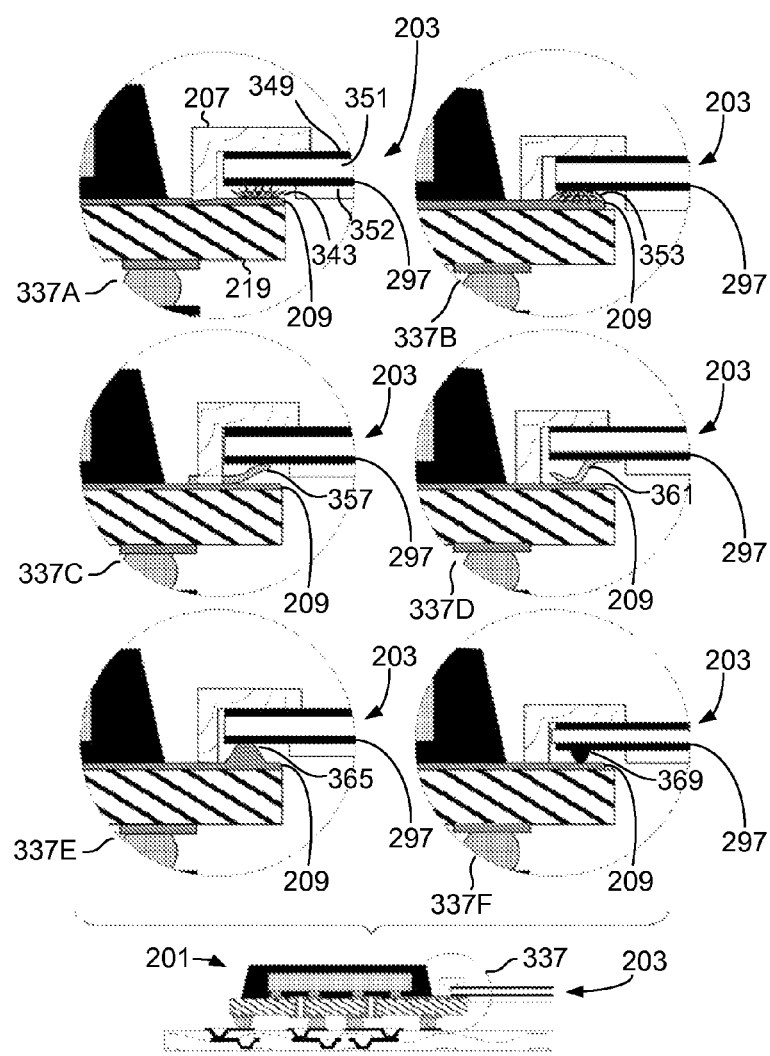
FIG. 6 illustrates contact technologies that may be used to establish electrical connection between traces disposed on the substrate of an integrated circuit package and conductors within a direct-connect cable.

FIG. 6 illustrates representative contact technologies that may be used to establish electrical connection between traces 209 disposed on the substrate of integrated circuit package 201 and conductors 297 within the direct-connect cable 203. Referring to detail view 337A, a conductive spur or dendritic contact 343 may be soldered, formed or otherwise secured to each trace 209 disposed on the package substrate 209 and used to establish the electrical connection by piercing a corresponding conductor 297 within the direct-connect cable 203. Conversely, as shown in detail view 337B, a spur or dendritic contact 353 may be secured to the direct connect cable conductor 297 and used to establish the electrical connection by piercing the corresponding substrate trace 209.

Referring again to detail view 337A, connector 207 is used to couple the direct-connect cable to the exposed region of the package substrate 219. Also, in the embodiment depicted, the direct-connect cable includes insulating layers 351 and 352 disposed above and below the conductors 297, and a shield layer 349 disposed above insulating layer 351. As discussed above, an additional shield layer may be disposed beneath insulating layer 352 to form a stripline or coplanar stripline cable.

In another embodiment, depicted in detail view 337C, finger-like protruding elements 357 secured to the substrate traces 209 are used to make electrical contact with the cable conductors 297. The protruding elements 357 are preferably fabricated from a resilient spring-like material that is biased against the conductors 297 as the direct-connect cable 203 is secured to the substrate, though other types of materials may be used. As shown in detail view 337D, finger-like protruding elements 361 may alternatively be secured to the cable conductors 297 and urged against the substrate traces 209 when the direct-connect cable 203 is connected to the substrate. Detail view 337E illustrates yet another embodiment in which point contacts 365 secured to or formed integrally with the substrate traces 209 are used to contact corresponding conductors 297 within the direct-connect cable 203. Referring to detail view 337F, point contacts 369 may alternatively be secured to or formed integrally on the ends of the cable conductors 297 and used to contact substrate traces 209. Numerous other structures may be used to establish electrical connection between the conductors 297 of the direct-connect cable 203 and substrate traces 209 in other embodiments including, without limitation, solder joints, spring-style contacts, male-to-female connection structures, particle interconnect structures and so forth. More generally, any structures or techniques may be used to connect the conductors 297 of the direct-connect cable 203 to corresponding contacts disposed on or within the substrate 219 without departing from the spirit and scope of the present invention.

Figure 7:
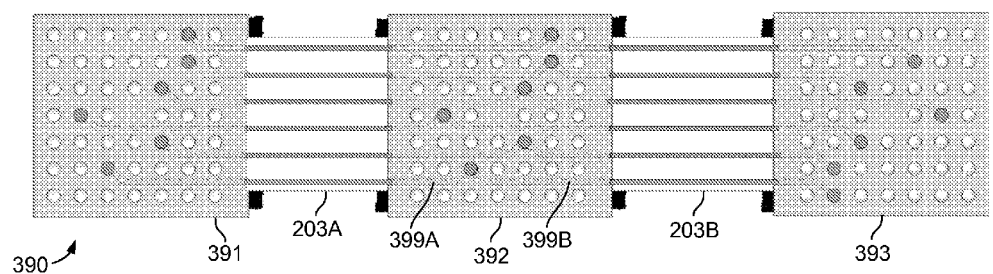
FIG. 7 illustrates a set of integrated circuit packages coupled one another via multiple direct-connect cables to establish a multi-drop signaling system.

FIG. 7 illustrates a set of integrated circuit packages 391, 392 and 393 coupled one another via two direct-connect cables 203A and 203B to establish a multi-drop signaling system 390. Referring to integrated circuit package 392, each of the substrate traces includes a pair of trace segments 399A and 399B extending to opposite contact zones. Thus, the multi-segment substrate traces of the integrated circuit package 392 (which is referred to herein as a bridging integrated circuit package ("bridging IC")) form a bridge between direct-connect cables 203A and 203B and, together, the conductors of the direct-connect cables 203A and 203B and the multi-segment traces of integrated circuit package 392 form a continuous signal path between each of the integrated circuit packages 391, 392 and 393. Because the signal path contacts the die pads of integrated circuit package 392 without the lengthy stub connections typically present in a circuit-board-routed signal path, the parasitic capacitance and signal reflections that plague many multi-drop signaling systems are substantially reduced. Note that any number of bridging ICs may included within the signaling system 390. Also, the bridging IC 392 may include direct-connect contact zones on adjacent edges, rather than on the opposite edges shown. The signaling system 390 may be a master/slave system in which slave devices drive signals onto the direct-connect signaling path in response to commands or requests from the master device (e.g., memory controller and slave memory devices); a peer-to-peer signaling system in which any of the integrated circuit packages (or subset thereof) may obtain control of the signal path and output signals onto the signaling path of its own volition; or any other signaling system in which multi-drop operation is desired. In other embodiments, the bridging IC 392 may include more than two direct-connect contact zones (with a set of trace segments extending to each contact zone), enabling more than one multi-drop signaling path to be established by the bridging IC 392, or enabling a star topology with the bridging IC 392 constituting a hub device.

Figure 8:
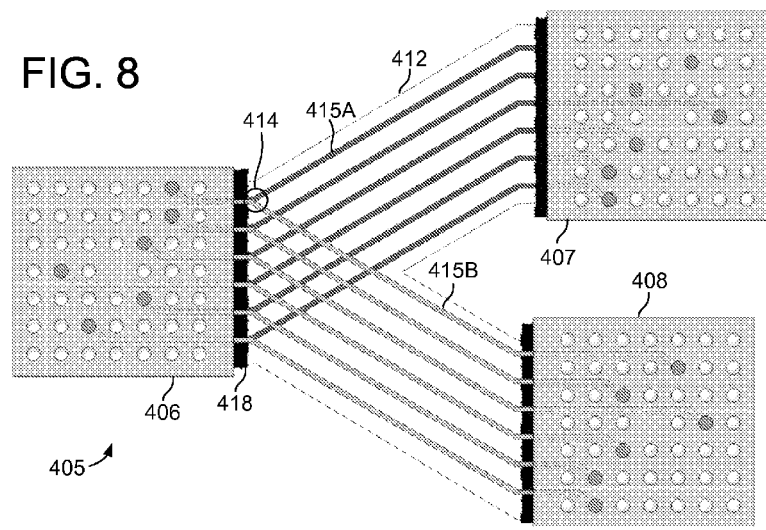
FIG. 8 illustrates a direct-connect cabling assembly used to establish a multi-drop signaling system.

FIG. 8 illustrates an alternative direct-connect signaling system 405 used to establish a multi-drop signaling path. Rather than establish multi-drop routing through multi-segment traces on a package substrate, two sets of conductors 415A and 415B are provided within a direct-connect cable assembly 412, with each set of conductors being coupled between an intermediate integrated circuit package 406 and a respective end-point integrated circuit package 407, 408. The conductors of set 415A are coupled respectively to the conductors of set 415B to establish a multi-drop signaling path extending between the end-point packages 407, 408 and coupled to the intermediate package 406. In one embodiment, the conductor sets are coupled to one another within the connector 418 (e.g., connected via solder joint, pressure contact or other conductive coupling) to form a Y-joint 414 between respective pairs of conductors. In alternative embodiments, the conductors 415A, 415B may be coupled to one another at points along their lengths rather than at the connector 418. Also, in alternative embodiments, more than two sets of conductors may be included within the direct-connect cable assembly 412 and coupled to one another to enable connection to any number of additional intermediate integrated circuit packages (e.g., using Y-joint connections 414 at each additional intermediate integrated circuit package).

Figure 9:
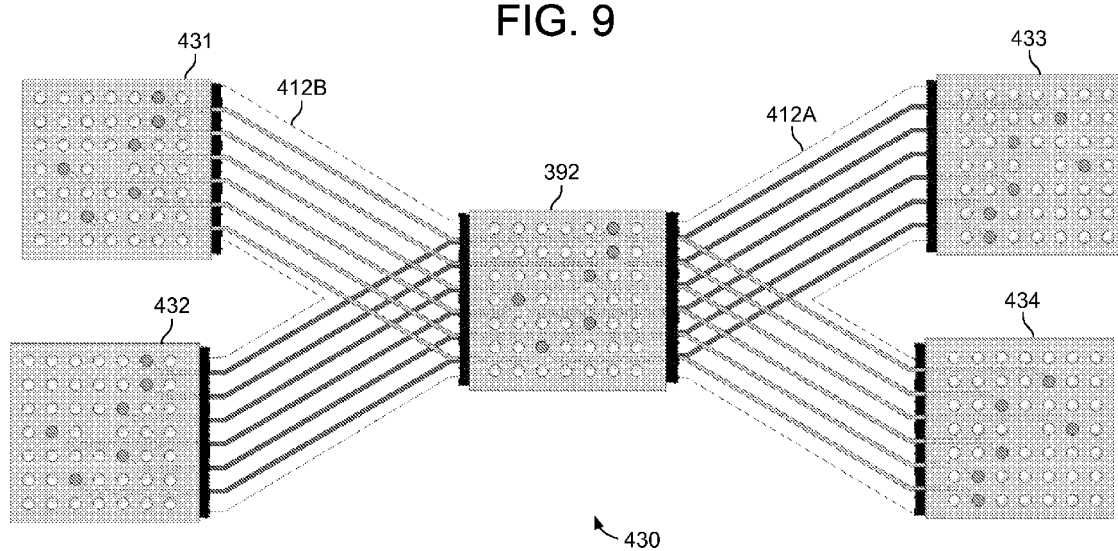
FIG. 9 illustrates a star-type interconnect topology achieved using the direct-connect cable assembly of FIG. 8.

FIG. 9 illustrates a star-type interconnect topology 430 achieved using a pair of direct-connect cable assemblies of FIG. 8 (i.e., assemblies 412A and 412B), and the bridging IC 392 of FIG. 7. The bridging IC 392 constitutes a hub device of the star topology, and is coupled to each of end-point integrated circuit packages 431, 432, 433 and 434. Thus, as can be seen in the examples of FIGS. 7, 8 and 9, virtually any high-speed interconnect topology may be implemented using the direct-connect cable assemblies and/or bridging IC described in reference to FIGS. 6 and 7.

Figure 10:
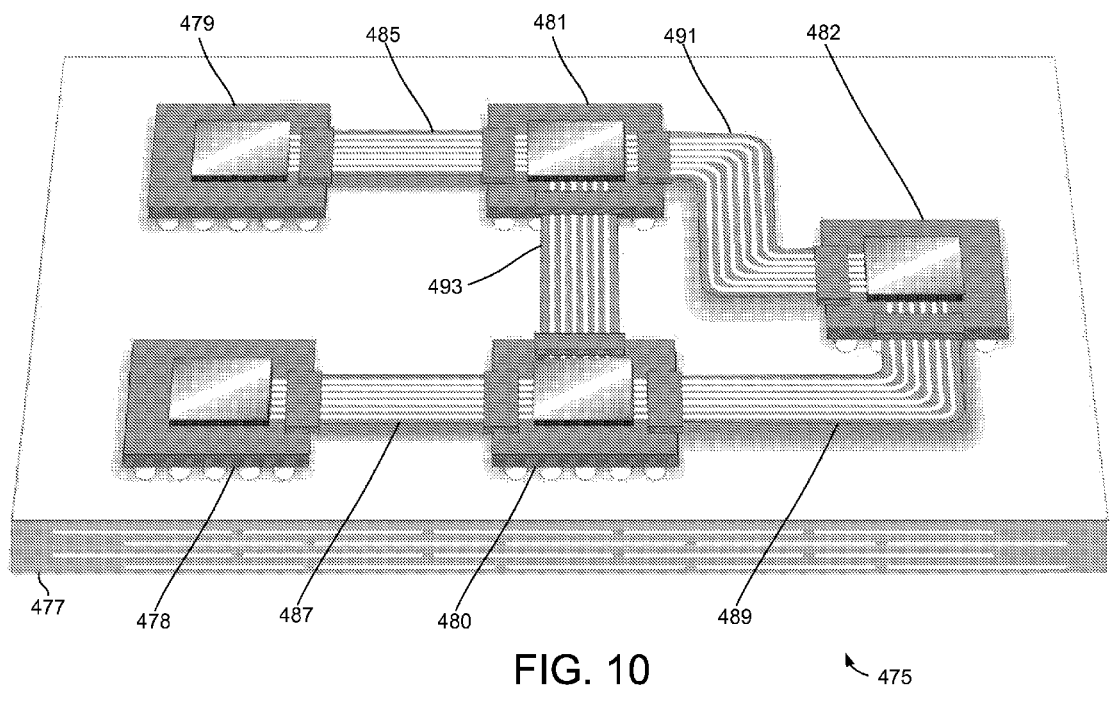
FIG. 10 illustrates an exemplary arrangement of direct-connect signaling paths established between a number of integrated circuit packages mounted on a printed circuit board.

FIG. 10 illustrates an exemplary arrangement of direct-connect signaling paths 485, 487, 489, 491 and 493 established between a number of integrated circuit packages (478, 479, 480, 481 and 482) mounted on a printed circuit board 477. Numerous other components (not shown) may be mounted to the printed circuit board 477 and interconnected to one another and/or to the integrated circuit packages 478-482 using conventional interconnection structures, or using additional direct-connect cables. As shown, the direct-connect cables used to establish signaling paths between the integrated circuit packages 478-482 include straight line cables 485, 487 and 493, S-type cable 491, and elbow cable 489. Cables having any other number of bends or shapes may also be used. Also, though coplanar cables are depicted, other cabling geometries may be used (e.g., coaxial cables). Integrated circuit package 481 may be a bridging IC to establish a through connection between all or a pair of the direct-connect cables 485, 491 and 493. Alternatively, the direct-connect cables 485, 491 and 493 may each be coupled to distinct sets of I/O circuits within integrated circuit package 481. Integrated circuit packages 480 and 482 may similarly be bridging ICs to establish through-connections between direct-connect cables. It should be noted that the direct-connect signaling paths illustrated in FIG. 10 may be applied, or modified for application, to virtually any type of system in which high-speed signaling between integrated circuit packages is needed. For example, direct-connect cables may be used to establish connections between integrated circuit packages in a data processing system (e.g., between a general or special-purpose processor and a corresponding chipset component or application specific integrated circuit, or between a memory controller and memory devices and/or memory modules), network switching system (e.g., between integrated circuit packages on one or more line cards, switch fabric cards, etc.), transponder system, high-speed data multiplexing system and so forth.

Figure 11:
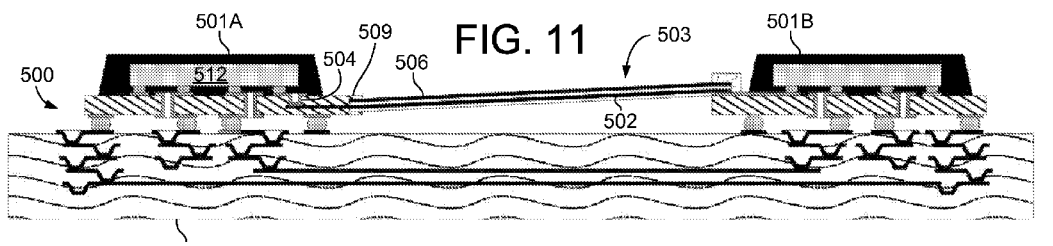
FIG. 11 illustrates a direct-connect signaling system according to an alternative embodiment of the invention.

FIG. 11 illustrates a direct-connect signaling system 500 according to an alternative embodiment of the invention. The signaling system 500 includes a pair of integrated circuit packages 501A and 501B mounted to a printed circuit board 507 and coupled to one another via a direct-connect cable 503. In contrast to the direct-connect cable 203 of FIG. 3, the direct connect cable 503 does not include connectors at both ends, but rather is an integral component of integrated circuit package 501A. In the embodiment shown, the direct-connect cable 503 is received within an edge of the package substrate 509 (e.g., a concavity formed between the upper and lower surfaces of the package substrate 509) and electric signal conductors 502 of the direct-connect cable 503 extend within the substrate 509 (e.g., along the surface of an internal layer of the substrate) to contact a set of vias 504 or other conductive structures coupled to the integrated circuit die 512. Alternatively, the conductors 502 of the direct-connect cable 503 may extend along the top surface of the package substrate 509 to contact the die 512 directly (obviating the vias 504). In yet other embodiments, the conductors 502 of the direct-connect cable 503 may extend along the bottom surface of the package substrate 509 and contact the die 512 through vias or other conductive structures disposed within the package substrate 509. As with the direct-connect cable 203 of FIG. 3, the direct connect cable 503 may be flexible or rigid, and may be a micro-stripline (i.e., having conductive shield 506), coplanar stripline, or non-coplanar cable (e.g., coaxial or other non-coplanar arrangement).

Figure 12:
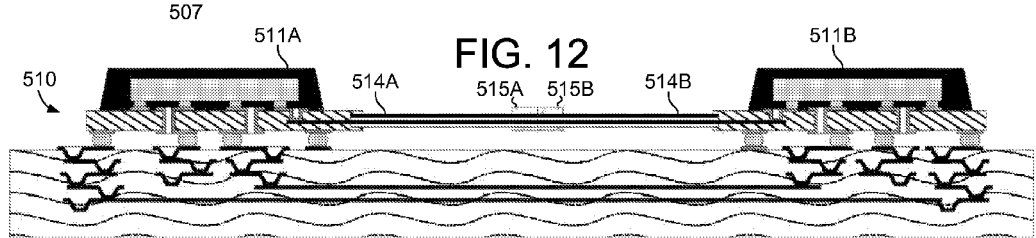
FIG. 12 illustrates a signaling system embodiment that includes integrated circuit packages each having an integral direct-connect cable with a mid-span connector.

FIG. 12 illustrates a signaling system embodiment 510 that includes integrated circuit packages 511A, 511B mounted to printed circuit board 517 and each having an integral direct-connect cable 514A, 514B that terminates in a respective mid-span connector 515A, 515B. In one embodiment, the mid-span connectors 515A and 515B are different from one another, with mid-span connector 515A being adapted to receive protruding contacts of the mid-span connector 515B (i.e., a male/female connector pair). In alternative embodiments, the mid-span connectors 515A and 515B are identical to one another and include latching structures to maintain the respective sets of conductors within the cables 514A and 514B in aligned contact with one another. The mid-span connectors 515A and 515B may be permanently or removably coupled to one another. As in the embodiment of FIG. 11, conductors within either or both of the direct connect cables 514A and 514B may extend, in whole or part, within the corresponding package substrate (as shown) or on either surface thereof. Also, the direct connect cables 514A and/or 514B may be flexible or rigid, and may be micro-stripline (i.e., having conductive shield 506), coplanar stripline, or non-coplanar cables.

Figure 13:
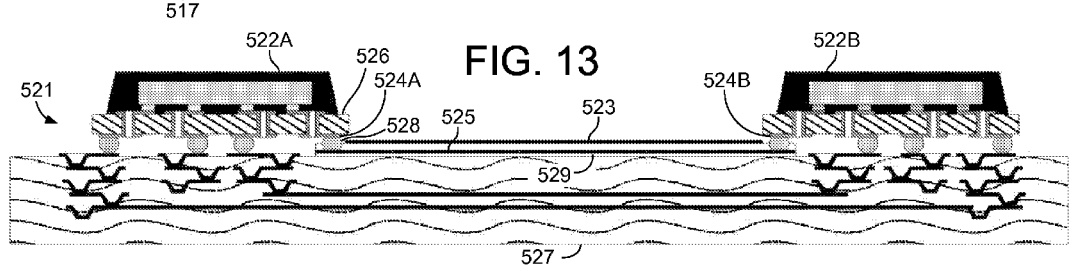
FIG. 13 illustrates a direct-connect signaling system according to another embodiment of the invention.

FIG. 13 illustrates a direct-connect signaling system 521 according to another embodiment of the invention. The signaling system 521 includes integrated circuit packages 522A and 522B coupled to on another via a direct-connect cable 523 that rests on a printed circuit board 527 along all or part of its length. The direct-connect cable 523 is preferably a coplanar structure having a plurality of parallel conductors, but may alternatively be a coaxial or other non-coplanar cable. Also, the conductors 525 of the direct-connect cable may directly contact landings 524A or other conductive structures on the underside of the package substrate 526 or, as shown in FIG. 13, may be coupled to the integrated circuit packages by conventional interconnect structures such as contact balls 528 (e.g., contact balls of a BGA), contact springs or the like. By this arrangement, the direct-connect cable 523 may be used with conventionally fabricated integrated circuit packages, including the flip-chip packages 522A, 522B depicted in FIG. 13, or integrated circuit packages having leads or other contacts for contacting conductors within the direct-connect cable 523. While the above-described problems associated with signal redistribution within the integrated circuit package may remain in the embodiment of FIG. 13, the parasitic capacitance, signal reflections and signal skew associated with PCB routing may be significantly reduced, thereby enabling higher signaling rates and relieving routing congestion in the printed circuit board 527. The conductors 525 of the direct-connect cable 523 are preferably electrically isolated from the printed circuit board by a layer of low-loss dielectric material 529 so that conductive traces printed or otherwise formed on the top surface of the printed circuit board 527 may be routed beneath the cable. As with the direct-connect cables described above in reference to FIGS. 3, 9 and 10, the direct-connect cable 523 is preferably flexible to enable the cable to be routed up and over (and/or around) other components mounted on the printed circuit board 527 (e.g., other integrated circuit devices or circuit components disposed between the integrated circuit packages 522A and 522B). Alternatively, the direct-connect cable 523 may be rigid. Also, the direct-connect cable 523 may be secured to the printed circuit board 527 during system assembly (e.g., using an adhesive or fastener), or allowed to rest unsecured on the printed circuit board 527.

Figure 14A:
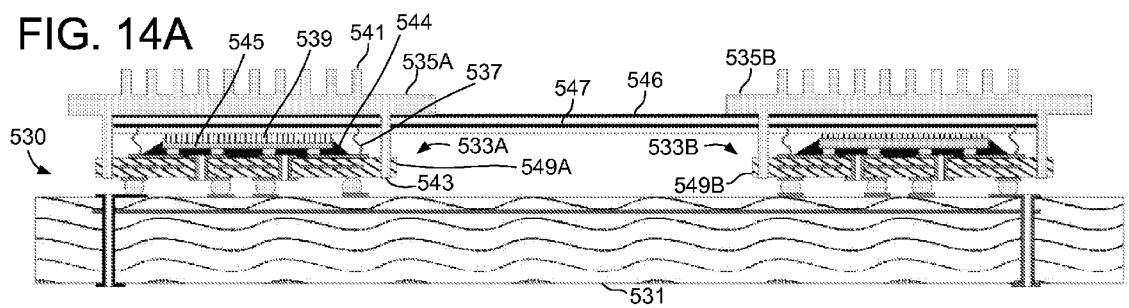
FIGS. 14A-14C illustrate a direct-connect signaling system according to another embodiment of the invention.
Figure 14B:
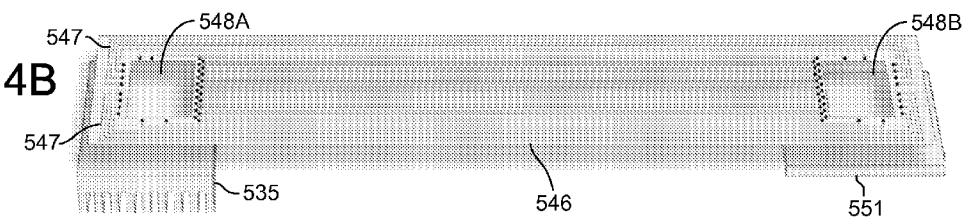
Figure 14C:
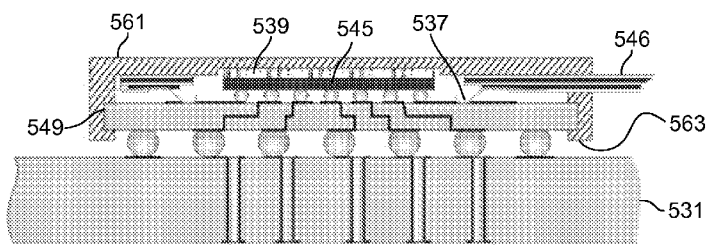

FIGS. 14A-14C illustrate a direct-connect signaling system 530 according to another embodiment of the invention. Referring first to FIG. 14A, a direct-connect cable 546 extends between integrated circuit packages 533A and 533B mounted to circuit board 531, and is secured to each package 533 by a respective one of lid components 535A and 535B. In one embodiment, spring-type contacts 537 extend from the direct-connect cable 546 to contact traces disposed on the surface of the package substrates 549A, 549B (e.g., as described in reference to FIGS. 4A-4C). Other cable-to-package interconnection structures and techniques may be used in alternative embodiments including, without limitation, the contact structures and techniques described above in reference to FIG. 6. In the embodiment of FIG. 14A, the lid component 549 is formed from a heat conducting material and includes a heat sinking structure 541 (e.g., fins) disposed in contact with the top surface of the package housing 544. A heat conducting material 539 (or adhesive) may be used to improve heat conduction from the integrated circuit package 533 to the lid component 535.

In one embodiment, illustrated in FIG. 14B, the individual conductors 547 of the direct-connect cable 546 are routed around openings 548A and 548B within the cable 546 that are sized according to the integrated circuit die housing 544, thereby enabling more direct connection between the package housing 544 and the lid component 535. Alternatively, the opening may be omitted and the conductors 547 routed directly over the top of the package housing. The heat sinking structure 541 may be distinct from the lid component 535 or omitted altogether in alternative embodiments (e.g., as shown at 551 of FIG. 14B), and the lid component 535 may be formed from materials other than heat conducting materials.

In the embodiment of FIG. 14A, the lid component 535 includes protruding members 543 that extend into counterpart holes or slots within package substrate 549 to fasten the lid component 535 to the substrate 549. Referring to FIG. 14C, a lid component 561 may alternatively be secured to the package substrate 549 by members 563 that snap about outside edges of the package substrate 549, securing the lid component 561 against upper and lower surfaces of the substrate 549. In such an embodiment, the housing may be omitted, and heat conducting material disposed directly between the integrated circuit die 545 and the lid component 561. More generally, any mechanism or material for securing the lid 561 (or 535) and direct-connect cable 546 to the integrated circuit packages 533 may be used without departing from the spirit and scope of the present invention.

Figure 15A:
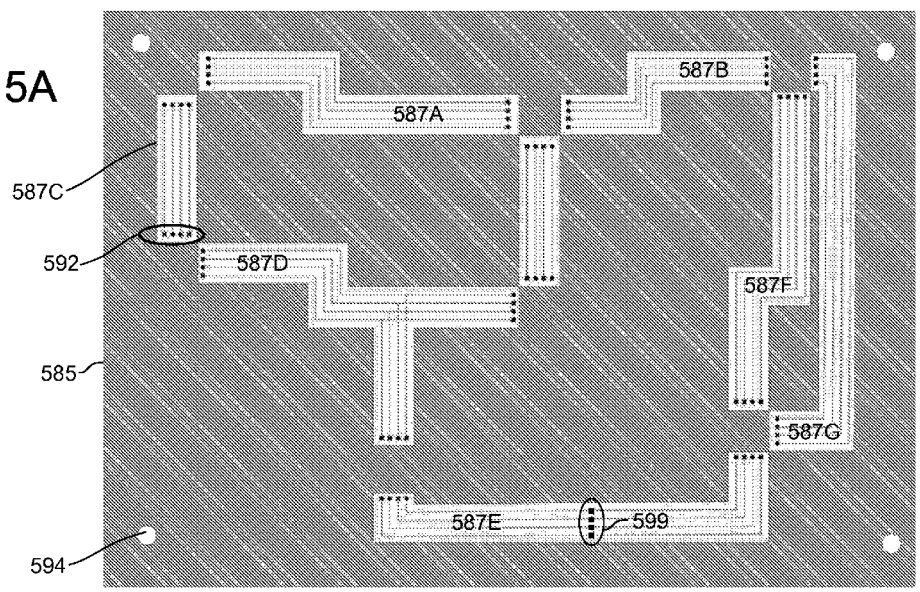
FIGS. 15A and 15B illustrate a direct-connect signaling system according to another embodiment of the invention.
Figure 15B:
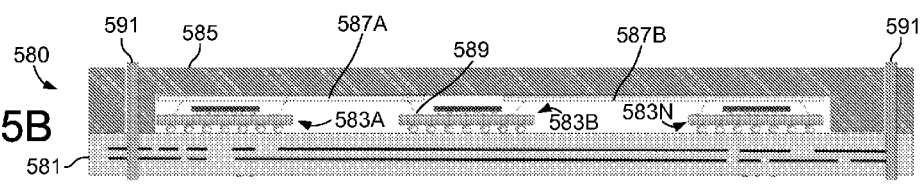

FIGS. 15A and 15B illustrate a direct-connect signaling system 580 according to another embodiment of the invention. Rather than discrete direct-connect cables, direct-connect signaling paths 587A-587G are disposed in a superstructure 585 that is mounted to a printed circuit board 581 over the top of integrated circuit packages 583A-583N (note that only direct-connect signaling paths 587A and 587B are shown in the profile view of FIG. 15B). In the embodiment of FIG.

15B, posts 591 are secured to printed circuit board 581 and are received in holes 594 of the superstructure 585 to align the superstructure 585 and printed circuit board 581. Other alignment techniques may be used in alternative embodiments.

The direct-connect signaling paths 587 may be formed by conductive traces printed or otherwise disposed on the superstructure 585, or by securing one or more of the direct-connect cables described in reference to FIGS. 3-14 to a surface of the superstructure 585. In either case, contact structures 589 are provided to establish contact between terminals 592 of the direct-connect signaling paths and contacts disposed on the substrates of the integrated circuit packages 583. Though the contact structures 589 are depicted as protruding-finger type contacts in FIG. 15B, other types of contact structures may be used including, without limitation, the contact structures described in reference to FIG. 6. Referring to FIG. 15A, it can be seen that the direct-connect signaling paths 587A-587G may form point-to-point links 587A, 587B, 587C, 587F and 587G between integrated circuit packages, as well as multi-drop signaling structures 487D and 587E. Referring specifically to multi-drop structure 587E, it can be seen that a contact regions 599 is disposed at a point along the length of the signaling path 587E (i.e., as opposed to at the ends), thereby limiting the stub extending from each contact within contact region 599 to the combined length of the contact structure 589 and package substrate trace. Note that such mid-span contacts may be used with other direct-connect cables described herein, thereby establishing multi-drop signaling paths without requiring the bridging IC 382 described in reference to FIG. 7 or cable assembly 412 described in reference to FIG. 8. Also, to facilitate fine alignment between the contacts of the direct-connect signal paths 587A-587G and counterpart contacts on the integrated circuit packages 583, apertures may be provided in superstructure 585 above contact points 592.

Figure 16A:
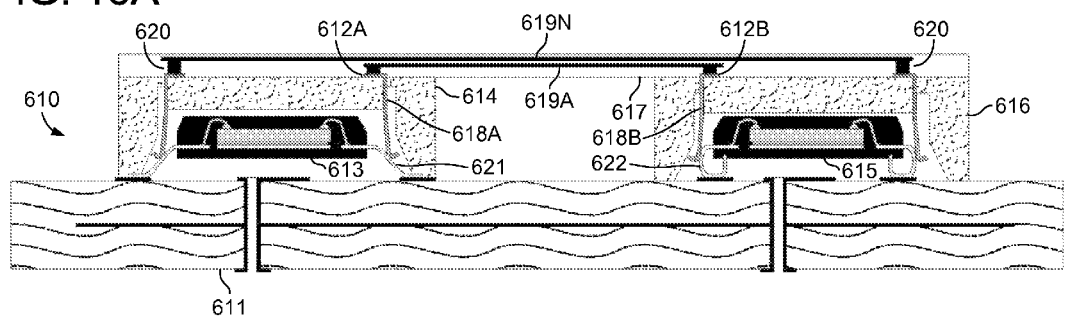
FIGS. 16A and 16B illustrate direct-connect signaling systems that include leaded integrated circuit packages.
Figure 16B:
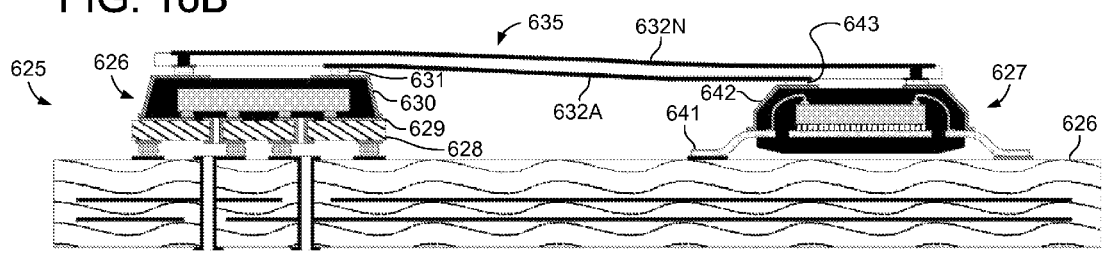

FIGS. 16A and 16B illustrate direct-connect signaling systems 610 and 625, respectively, that include leaded integrated circuit packages, instead of or in combination with the flip-chip packages shown in FIGS. 3 and 9-12. Referring to FIG. 16A, a direct-connect cable 617 extends above leaded integrated circuit packages 613 and 645 and is secured to the integrated circuit packages by sockets 614 and 616. That is, socket 614 is disposed about integrated circuit package 613 and includes conductive members 618A that extend from respective cable connection points 612A to corresponding leads 621 of the integrated circuit package 613. Socket 616 is similarly disposed about integrated circuit package 615 and includes conductive members 618B that extend from respective cable connection points 612B to corresponding leads 622 of the integrated circuit package 615. Conductors 619A-619N within the cable extend between respective pairs of contacts 620 with the conductive members 618. As with the direct-connect cables described above, the direct connect cable 617 is preferably flexible to enable interconnection of the integrated circuit packages 613 and 615 as the packages are disposed at different positions and orientations relative to one another. Alternatively, the direct-connect cable 617 may be rigid. Also, the direct-connect cable may be a microstripline, coplanar stripline, or non-coplanar cable. Finally, though the integrated circuit packages 613 and 615 are depicted as being gull-wing-leaded and J-leaded packages, respectively, packages with other types of leads may be used in alternative embodiments.

In FIG. 16B a direct-connect cable 635 is used to interconnect a flip-chip integrated circuit package 626 and a leaded package 627. The flip-chip package 626 is implemented generally as described in reference to FIG. 3, with conductive traces 629 being routed along a surface of the package substrate 628 to contact zones at an exposed region of the substrate 628. Conductive structures 630 are disposed in contact with the traces 629 and extend along the surface of the package housing to a top surface of the housing. Contacts 631 (e.g., solder balls or other structures) are provided to make electrical connections between the structures 630 and conductors 632A-632N of the direct-connect cable 635. At the leaded package 627, conductive structures 642 are similarly extended from the package leads 641 to the top surface of the package housing, where the contacts 643 are used to make electrical connections with the conductors 632A-632N of the direct-connect cable 635. In alternative embodiments, the flip-chip package 626 may be coupled to the direct-connect cable 635 using any of the connection techniques and structures described above in reference to FIGS. 3-14. Similarly, the leaded package 627 may be coupled to the direct-connect cable 635 using the socket arrangement described in reference to FIG. 16A. Further, the direct-connect superstructure 585 described in reference to FIGS. 15A and 15B may be used in place of the discrete direct-connect cables 617 and 635 illustrated in FIGS. 16A and 16B.

FIGS. 17A-17F illustrate additional direct-connect signaling system embodiments. Referring first to FIG. 17A, integrated circuit packages 653 and 657 are mounted on distinct printed circuit boards 651 and 655, respectively, and coupled to one another via a direct-connect cable 659. The printed circuit boards 651 and 655 may be arbitrarily positioned with respect to one another and separated by any tolerable signaling distance. The printed circuit boards 651 and 655 may have additional integrated circuit packages coupled to one another through one or more other-direct connect cables, or in a multi-drop arrangement as described in reference to FIG. 7. Also, the direct-connect cable 659 may include multiple sets of conductors as described in reference to FIG. 8 to enable interconnection of multiple integrated circuit packages on the two printed circuit boards 651 and 655.

FIG. 17B illustrates a direct-connect signaling system in which an integrated circuit package 663 mounted on a motherboard or backplane 661 is coupled via a direct-connect cable 669 to an integrated circuit package 667 mounted on a daughterboard 665 (i.e., a printed circuit board removably coupled to the motherboard via connector 670 or a similar structure). FIG. 17C illustrates another direct-connect signaling system in which integrated circuit packages 678 and 682 are mounted on respective daughterboards 676 and 680 and coupled to one another via a direct-connect cable 684. The daughterboards 676 and 680 are removably inserted into respective connectors 684 and 686 of a backplane or motherboard 675. Exemplary applications of the signaling systems of FIGS. 17B and 17C include, without limitation, line cards or other cards inserted into a backplane within a network switching apparatus (e.g., switch or router), memory modules inserted into the motherboard or backplane of a computing device or consumer electronic device, and so forth.

FIG. 17D illustrates yet another direct-connect signaling system in which integrated packages 697 and 699 are mounted on opposite sides of a printed circuit board 695 or other substrate, and are coupled to one another via a direct-connect cable 700. As with the signaling system of FIG. 17A, each of the embodiments depicted in FIGS. 17B-14D may include additional integrated circuit packages coupled to one another through direct-connect cables, and the direct-connect cables 669, 684 and 700 may include multiple sets of connectors as described in reference to FIG. 7 to enable interconnection of multiple integrated circuit packages.

FIG. 17E illustrates a signaling system 710 according to another embodiment of the invention. The signaling system 710 includes a first integrated circuit package 712 mounted to a printed circuit board 711 and coupled to conductors of a direct-connect cable assembly 717 via bond wires 715 or other contact structures. Other bond wires may be used to couple the integrated circuit die to solder balls or other contacts on the underside of the integrated circuit package 712. The direct-connect cable assembly 717 includes a lid component 714 having fastening members 716 to secure the assembly 717 to the integrated circuit package 712. The direct-connect cable assembly also includes a connector 719 to secure the remote end of the cable assembly 717 to another printed circuit board 721 and to couple the conductors of the cable assembly 717 to traces disposed on the printed circuit board 721. The printed circuit board traces are coupled to leads (or other contacts) of another integrated circuit package 723, thereby completing a high-speed signaling path between the integrated circuit packages 712 and 723. Thus, the overall high-speed signaling path of system 710 is a hybrid path having a direct-connect cable connection to the integrated circuit package 712, and a conventional connection to integrated circuit package 723. The cable-to-board connector 719 may be permanently or removably secured to the printed circuit board 721.

Still referring to FIG. 17E, it should be noted that integrated circuit package 712 may alternatively be any of the types of integrated circuit packages and have any of the cable connections described in reference to FIGS. 3-13. Similarly, though integrated circuit package 723 is depicted as a J-lead surface-mount integrated circuit package, any other type of integrated circuit package may be used in alternative embodiments. Also, though the direct-connect cable assembly 717 is depicted as being coupled to only one integrated circuit package 712, the cable may be coupled to one or more additional packages as described above in reference to FIGS. 6 and 7. Further, the integrated circuit packages 712 and 723 may be mounted to the same circuit board rather than the distinct circuit boards 711 and 721 depicted in FIG. 17E.

FIG. 17F illustrates a signaling system 730 according another embodiment of the invention. The signaling system 730 includes a first integrated circuit package 733 mounted to a printed circuit board 731 and coupled to a direct-connect cable 735. Instead of being coupled to another integrated circuit package, however, the conductors of the direct-connect cable 735 are coupled to terminals 738 within an integrated circuit board connector 737. In one embodiment, the integrated circuit board connector 737 is a socket-style connector adapted to receive an edge connector of a printed circuit board 739 having other components 740 disposed thereon (e.g., a line card, memory module, etc.). Other types of connectors may be used in place of connector 737 in alternative embodiments (e.g., pin extensions adapted for insertion into a female connector on a daughterboard), and the direct-connect cable 735 may be permanently or removably coupled to the connector 737. Also, the connector 737 may alternatively be mounted on the opposite side of the printed circuit board 731 from the integrated circuit package 733, or on another printed circuit board altogether. The integrated circuit package 733 may alternatively be any of the types of integrated circuit packages and have any of the direct-connect cable connections described in reference to FIGS. 3-16.

FIGS. 18A-18D illustrate an exemplary connector system 763 that may be used to establish a direct-connect cable connection between integrated circuit packages 761A and 761B, or between an integrated circuit package 761 and a printed circuit board (including a module, such as a memory module). Referring first to FIGS. 18A and 18B, connection is made by a "clam shell" like connector system 763 that aligns and holds fast a transmission cable 760, with planar in-line or array contacts, to the edge of an interconnection component (e.g., the substrate of an integrated circuit package 761 or printed circuit board or module).

In one embodiment, depicted in greater detail in FIG. 18C, the clam shell connection system 763 includes the following: a top lip of the clam shell connector 773 that is flat (for use where electrical connections are to be made only at a top surface of a substrate); a bottom lip of the clam shell connector 771 that includes a spacer 772 of the thickness of the substrate of the interconnect component 761; a flex circuit/transmission cable 760 that carries the electrical signals to and from conductors (shown at 792 in FIG. 18D) disposed on the interconnect component 761, and that makes connection through raised surfaces or protruding structures (i.e., serving as terminals) on either the conductors of the cable 760 or the conductors of the interconnect component 761; alignment pins 781 to assure alignment of the direct-connect cable to the contact terminals of the interconnect component 761 and to provide a mechanical anchor and prevent inadvertent pull-off due to shock or vibration; guide pins 775 that allow the top and bottom lips of the connector 771 and 773 to hold alignment to one another as they travel in the z-direction (more or fewer guide pins may be provided in alternative embodiments); springs 777 that urge the connector halves apart for insertion or for removal when removal is required; and a fastening mechanism 779 (e.g., a threaded screw or other closing/force delivery device) that physically clamps the top and bottom lips of the clam shell 771, 773 against corresponding surfaces of the interconnect component 761. Note that the interconnect component (e.g., integrated circuit package substrate, printed circuit board or module, etc.) includes recessed areas 785, such as holes or slots, shaped to receive the alignment pins 781. Although two alignment pins 781 are shown in FIGS. 18B and 18C, more or fewer alignment pins 781 may be provided in alternative embodiments. Note that, if the clamshell connector system 763 is designed such that the spacer 772 abuts the edge of the interconnect component 761 to control alignment in the direction extending toward the interconnect component 761, then a single alignment hole may be used to establish alignment in the lateral direction along the edge of the interconnect component 761. Also, rather than pins, lengthwise protrusions (e.g., fins or blades) or other protrusion geometries may be used to establish alignment between the connector system 763 and interconnect component 761; the recessed areas 785 (e.g., holes, channels, grooves, etc.) in the interconnect component 761 being shaped according to the protrusion geometry. The alignment pins 781 may be located on either or both lips 771 and 773 of the connector system 763. Also, the alignment pins may alternatively be located on the interconnect component 761, and the recessed areas 785 on one or both of the lips 771 and 773.

Still referring to FIG. 18C, the depth of the throat of the connector system 763 (i.e., extension of the lips 771 and 773 over the interconnect component 761) is not critical but where thinner spacers 772 are used, a shallower throat may improve stiffness. Also, the bottom lip of the connector 771 does not have to be of the same depth as the top lip 773 and, in one embodiment, is of shallower depth. As discussed above, the bottom lip 771 may also include alignment pins 781 for more mechanical robustness. Also, as shown in FIG. 18D, the thickness of the bottom lip 771 of the connector is reduced to a value less than the anticipated clearance 794 between the package substrate and the printed circuit board 790 (the clearance being determined, at least in part, by the nature of the package-to-board contact 791). The top and bottom lips of the connector 771 and 773 may be formed from any material, and if made of conducting material, may be coupled to a ground reference (e.g., a shield layer) in the cable 760 and/or the interconnect component 761. In one embodiment, the alignment pins 781 are used to engage a ground reference conductor (or ground plane) and/or supply voltage conductor disposed on or within the interconnect component 761, thereby establishing a ground and/or power connection.

Referring to FIG. 18D, alignment between electrical contact points 794 (e.g., pads) disposed on the conductors of cable 760 and corresponding conductors 792 on the interconnect component 761 are established by the alignment pins 781. In one embodiment, the alignment holes 785 within the interconnect component 761 are drilled at specified locations relative to ends of the substrate conductors 792. Through-holes 796 for the alignment pins are also drilled in the cable 760 at specified locations relative to the cable contacts 794. When the alignment pins 781 of the connector top lip 773 are inserted into the through-holes 796 of the cable 760, the cable contacts 794 are aligned to contact the ends of the conductors 792 as the connector is closed on the interconnect component 761. As shown in FIG. 18C, the tip of the alignment pins 781 may be tapered to enable self-alignment of the pins 781.

The structures used to establish electrical contact between the direct-connect cable conductors and the traces 792 on the interconnect component 761 may include, but are not limited to, gold dots, nanopierce contacts, pogo-pins, elastomeric pads, micro-springs, plated bumps, particle interconnects, anisotropic conductive films, etc. Coplanarity of the height between different bump contacts, especially for high pin counts, may be achieved using any number of techniques including, without limitation, sandwiching an elastomer between the direct-connect cable and the top lip of the connector, and/or spring loaded contacts 795 behind any bump contact 794 on the direct-connect cable conductors as show in FIG. 18D.

As discussed above in reference to FIGS. 17E and 17F, direct-connect cables may be coupled at one end to an integrated circuit package and on the other end to a printed circuit board or to a circuit board (or module) connector. Accordingly, direct-connect cables may include the connector system 763 described in reference to FIGS. 18A-18D on one end only. The other end of the connector may include a surface mount or mezzanine type connector for connection to a printed circuit board (or module), or may be adapted for connection to contacts of a board or module connector as shown, for example, in FIG. 17F.

Figure 19A:
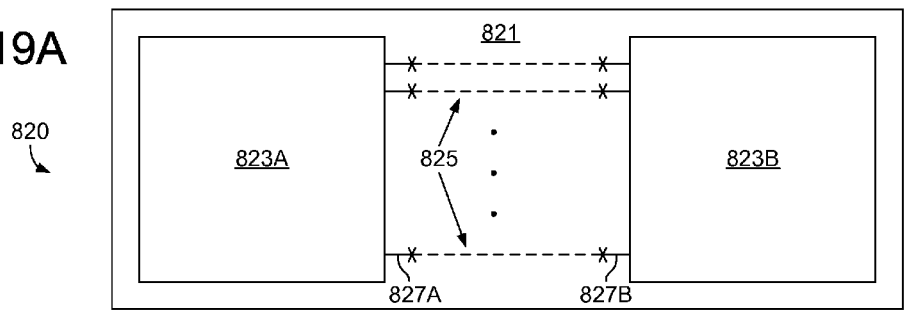
FIGS. 19A and 19B illustrate a direct-connect signaling within a multi-chip module according to an embodiment of the invention.
Figure 19B:
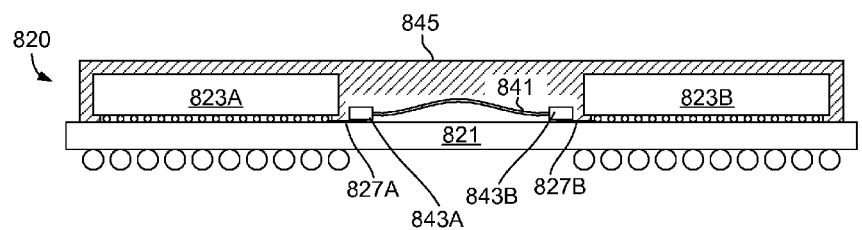

FIGS. 19A and 19B illustrate a direct-connect signaling system according to another embodiment of the invention. FIG. 19A is a top view of an integrated circuit package 820 having multiple integrated circuit dice 823A and 823B disposed on a shared package substrate 821 (two dice are shown in FIG. 19A, but any number of dice may be provided in other embodiments). In such integrated circuit packages, referred to herein as multi-chip modules (MCMs), interconnections between the dice 823 are typically made by traces printed one or more layers of the shared substrate 821. One drawback to this approach is that, once mounted to the substrate 821, high-speed testing of an individual die 823 becomes difficult due to the connections to one or more other dice 823. While the other dice 823 may, in some cases, be placed in a high impedance mode (e.g., all I/O circuits tri-stated), the substrate traces to such other dice 823 tend to act as stubs during high-speed signaling tests, degrading signal quality and making tests at run-time frequencies difficult or impossible. Also, while individual dice may be tested using wafer-probing techniques, the relatively high inductance of the probes usually prevents testing at run-time frequencies. Consequently, multi-chip modules are often completely assembled, then tested in their integrated form. The problem with this approach is that, if any one of the die within the multi-chip module is defective, the entire multi-chip module is typically discarded.

In one embodiment of the invention, many of the testability problems associated with multi-chip modules are overcome (or at least mitigated) by using a direct-connect cable to establish high-speed links (i.e., signaling paths) between dice. Thus, as illustrated by the discontinuities 825 in FIG. 19A (denoted by "x- - - - -x"), substrate trace connections between dice are left incomplete, and the traces are instead terminated in contact zones (827A, 827B) adapted to contact electric signal conductors within a direct-connect cable. FIG. 19B illustrates a side view of the arrangement in FIG. 19A, showing placement of a direct-connect cable 841. The direct-connect cable 841 includes a pair of connectors 843A, 843B permanently or removably secured to the contact zones 827A and 827B established by respective sets of traces extending from contacts of the integrated circuit dice 823A and 823B. By this arrangement, as each die 823 is mounted to the package substrate 821, a high-speed circuit tester (not shown) may be coupled to the corresponding contact zone 827 using a direct-connect test cable (e.g., a cable that corresponds to the cable 841 used to interconnect the package dice 823), and tested at run-time frequency. If the die passes the tests, another die may be mounted to the package and similarly tested, with direct-connect cables 841 coupled between pairs or groups of passing dice. If a die does not pass the tests, it may be removed from the substrate and replaced by another die. Alternatively, the partially constructed module may be discarded. In either case, individual die may be tested at run-time frequencies without having to complete assembly of the entire multi-chip module. Note that while the multi-chip module 820 shown in FIGS. 19A and 19B is a planar style module (i.e., all dice mounted in the same plane, for example, to the surface of a common substrate 821), direct-connect cables may also be used to form high-speed signaling paths between dice mounted in different planes of a stacked multi-chip module.

Figure 20:
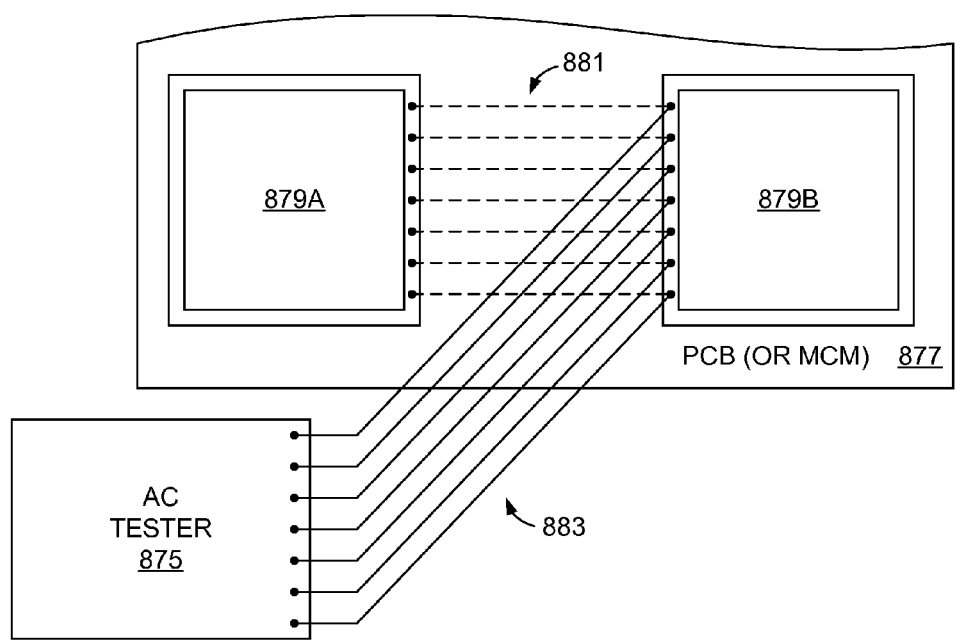
FIG. 20 illustrates a test arrangement that may be used to test circuit-board-mounted integrated circuit packages that are to be interconnected via a direct-connect cable, or integrated circuit die within a multi-chip module.

FIG. 20 illustrates a test arrangement that may be used to test circuit-board-mounted integrated circuit packages 879A and 879B that are to be interconnected via a direct-connect cable. A similar arrangement may be used to test dice mounted on a substrate of a multi-chip module that are to be interconnected via a direct-connect cable. Dashed lines 881 illustrate the path of the conductors of the yet-to-be-attached direct-connect connect cable, and 883 illustrates the direct-connect cable attachment to a high-speed test apparatus (e.g., an apparatus that generates programmed patterns of test signals). Because the interconnection between the integrated circuit packages 879A, 879B is not yet established, package 879A does not need to be driven to a high impedance state to test 879B. Also, unlike board level testing in which probes are used to contact test points on the printed circuit board 877, the parasitic capacitance and signal reflections from stub portions of the printed circuit board traces are avoided, thereby enabling the high-speed test apparatus execute signaling tests at run-time frequencies. After package 879B is tested, the direct-connect cable connection to integrated circuit package 879B may be removed, and a direct-connect cable connection to integrated circuit package 879A established. Thus, board level integrated circuit package testing may be executed at run-time frequencies, one integrated circuit package at a time. Direct-connect cables may be secured between each pair of integrated circuit packages (or group of integrated circuit packages) determined to pass package-level tests.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A system for connecting high speed signals to spaced integrated circuit packages, comprising:
   a pair of spaced integrated circuit packages, each having a top surface, mounted on a signal-interconnection substrate, the substrate including signal paths for slow-speed signals; the integrated circuit packages each being configurable for electrically connecting slow speed signals to said slow-speed signal paths; each of said integrated circuit packages including structure-contact traces configured to electrically couple high speed signals to top surface contacts located on the top surface of said integrated circuit packages,
   a structure including one or more high-speed electrical traces spanning the space between said integrated circuit packages; the structure spaced from said signal interconnection substrate and physically mounted to respective said top surfaces;
   a cable connector within which the high-speed electrical traces of the structure terminate, the cable connector being physically mounted on one of said integrated circuit packages, and the cable connector being configured to electrically couple the structure to the structure-contact traces of the one of said integrated circuit packages; and
   a trace-contact coupler configured to electrically couple the high speed electrical traces on said structure to said top surface contacts.

2. The system for connecting high speed signals of claim 1 wherein said structure comprises a cable.

3. The system for connecting high speed signals of claim 1 wherein said structure comprises a rigid structure.

4. The system for connecting high speed signals of claim 1 wherein said structure comprises a cable mounted on a rigid structure.

5. The system of claim 1 wherein said trace-contact coupler comprises solder.

6. The system for connecting high speed signals of claim 1 wherein the structure-contact traces are formed on sides of at least one of said integrated circuit packages.

7. The system of claim 1, wherein the structure-contact traces of the one of said integrated circuit packages terminate at a contact zone of the one of said integrated circuit packages, and wherein the cable connector is secured to the contact zone.

8. A system for transmitting high speed signals between integrated circuit packages, comprising:
   a circuit board with a first surface including a plurality of circuit board terminals;
   a cable including a first high speed signal path including first and second ends with corresponding first and second high speed terminals; and
   first and second IC packages including: i) respective first and second package terminals electrically coupled with corresponding first and second circuit board terminals, ii) a first package surface facing the first surface of the circuit board, and iii) a second package surface, the cable being physically mounted to the second package surface by a cable connector within which the first high speed signal path terminates, and the second package surface including corresponding third and fourth package terminals respectively coupled with the first and second high speed terminals.

9. The system of claim 8 wherein the first and second package surfaces of the first IC package face in opposite directions.

10. The system of claim 9 wherein the second package surface of the first and second IC packages face in a same direction.

11. The system of claim 8, the circuit board further comprising a first signal trace in electrical continuity with the first and second circuit board terminals.

12. The system of claim 11, the circuit board further comprising a plurality of conductive vias extending at least part way through the circuit board from the first surface.

13. The system of claim 12, wherein the ends of the first signal trace are coupled with first and second conductive vias.

14. The system of claim 13, the circuit board further comprising a second surface facing in an opposite direction from the first circuit board surface, wherein the first signal trace is disposed, at least in part, within an inner circuit board layer between the first and second circuit board surfaces.

15. The system of claim 8, the first package terminal being disposed on the first surface of the first IC package.

16. The system of claim 8, the first package terminal being coupled with the first circuit board terminal by a solder ball connection.

17. The system of claim 8, further comprising a wire lead extending outward from a body of the first IC package, the first package terminal being disposed on the wire lead.

18. The system of claim 17, the wire lead comprising gull wing shape.

19. The system of claim 17, the wire lead comprising a J-lead shape.

20. The system of claim 17, the wire lead further comprising an interior terminal disposed within the IC package, the IC package further comprising a bond wire and an IC die with a plurality of die terminals, the bond wire having a first end coupled with the interior terminal and a second end coupled with a first die terminal.

21. The system of claim 8, the first IC package further comprising:
   an IC die with a plurality of die terminals including a first die terminal;
   a substrate;
   a first circuit extending from the first package terminal to an interior package terminal; and,
   a terminal connector that is configured to electrically connect the interior package terminal with the first die terminal.

22. The system of claim 21, the terminal connector comprising a conductive bump.

23. The system of claim 21, the substrate comprising a signal path having a first end coupled with a second IC die, and a second end coupled with the third package terminal.

24. The system of claim 8, the IC package comprising flip-chip architecture.

25. The system of claim 8, further comprising a second high speed signal path electrically coupling a fifth package terminal disposed on the first IC package with a sixth package terminal disposed on the second IC package.

26. The system of claim 25, the first high speed signal path being insulatively protected by a first insulating member.

27. The system of claim 26, the second high speed signal path also being disposed within the first insulating member, and electrically insulated from the first high speed signal path.

28. The system of claim 26, the first high speed signal path and the first insulating member being members of a flexible circuit.

29. The system of claim 26, the first high speed signal path and the first insulating member being members of a rigid structure.

* * * * *